United States Patent [19]
Miyagawa

[11] Patent Number: 5,523,699
[45] Date of Patent: Jun. 4, 1996

[54] METHOD AND APPARATUS FOR TESTING SEMICONDUCTOR DEVICE

[75] Inventor: Ryuhei Miyagawa, Suwa, Japan

[73] Assignee: Seiko Epson Corporation, Tokyo, Japan

[21] Appl. No.: 67,031

[22] Filed: May 26, 1993

[30] Foreign Application Priority Data

Jun. 3, 1992 [JP] Japan .................................. 4-142378
Mar. 31, 1993 [JP] Japan .................................. 5-096962

[51] Int. Cl.$^6$ ........................... G01R 31/26; H01T 19/00
[52] U.S. Cl. ........................................... 324/765; 361/225
[58] Field of Search ................................. 324/765, 754, 324/536, 527, 766, 767, 768, 769, 72; 361/225

[56] References Cited

U.S. PATENT DOCUMENTS 4,636,724  1/1987  Fukuda et al. .......................... 324/527
4,677,375  6/1987  Nakaie et al. .......................... 324/754
4,823,088  4/1989  Fukuda ................................... 324/765

*Primary Examiner*—Ernest F. Karlsen
*Attorney, Agent, or Firm*—Oliff & Berridge

[57] ABSTRACT

An apparatus for testing a semiconductor device includes an insulation body on which an IC to be tested is placed; a high voltage source for generating an electrostatic charge; a capacitor and resistor; a variable discharge gap defined by a metal piece and a discharge electrode; a fixed discharge gap; a discharge resistor inserted into the discharge circuit; and a switch for conducting the electrostatic charge into the discharge circuit. When a high voltage is applied to the terminal to be tested in the IC, a corona or spark is generated at the discharge gap and the current is on rapidly into the terminal to be tested. Thus, a condition very similar to the actual electrostatic discharge phenomenon is reproduced.

22 Claims, 11 Drawing Sheets

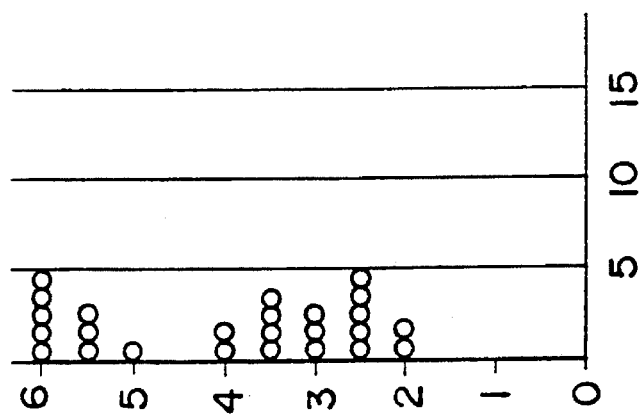
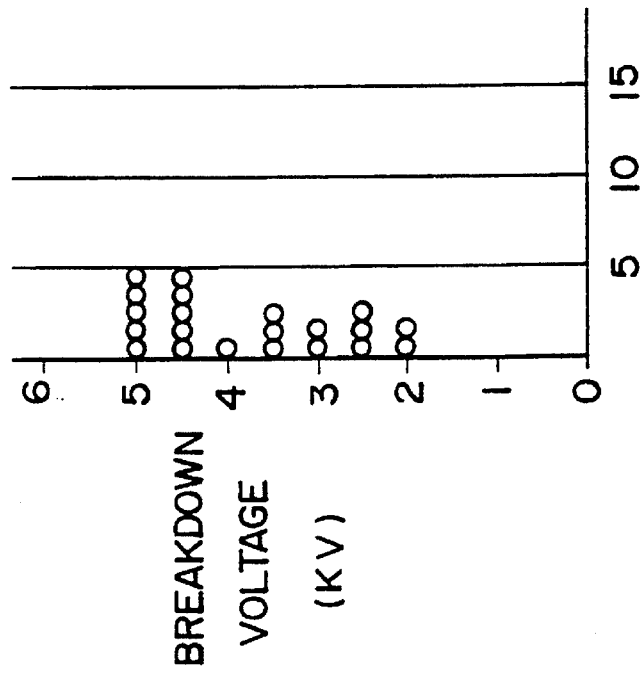
FIG. 3A  FIG. 3B  FIG. 3C
BREAKDOWN VOLTAGE (KV)

FIG. 5

|   | WIRE DIAMETER (φ) | GND LINE LENGTH (cm) | RESISTANCE (mΩ) | INDUCTANCE (μH) |
|---|---|---|---|---|
| a | 1.6 mm | 75 cm | 345 | 2.1 |
| b | 1.6 | 75 | 163 | 2.1 |
| c | 1.6 | 25 | 134 | 1.6 |
| d | 0.5 | 75 | 230 | 1.7 |
| e | 0.5 | 25 | 199 | 1.2 |
| f | 0.35 | — | 340 | 4.5 |
| g | 0.35 | — | 196 | 1.6 |
| h | 0.35 | — | 341 | 5.7 |
| i | 0.35 | — | 342 | 6.8 |
| j | — | — | 966 Ω | — |

METHOD AND APPARATUS FOR TESTING SEMICONDUCTOR DEVICE

BACKGROUND OF THE INVENTION

1. Field of the Invention

The present invention relates to a method and apparatus for testing the electrostatic discharge sensitivity which will be called "ESD sensitivity" of a semiconductor device such as a memory element or the like.

2. Description of Related Art

The most general method for testing the ESD sensitivity of a semiconductor device, which will be called an "IC" herein, is, at present, a capacitor discharge testing method in which a human body model is taken into account. Such a method is shown in FIG. 10. Referring to FIG. 10, a high-voltage power source 81 charges a capacitor 82, the charge of which is applied to a terminal to be measured 85 when a switch 83 is actuated. At this time, the charge is discharged to ground through an electrostatic protection diode 87 in the IC 86 and earthline 88.

Such a testing method has publicly been standardized, for example, as U.S. Standard MIL-STD-883D, Method 3015 in which a capacitor must have a capacity C=100 pF and a discharge resistor 84 must have a resistance R=1.5 k Ω. Japanese EIAJ Standard sets C=200 pF and R=0 Ω. Further, a charging protection resistor 89 is set to range between 1M Ω and 10M Ω.

There is also known another ESD testing method which is called "Charged Device Model test"(that will be called "CDM test" herein). FIG. 11 is a circuit diagram of the conventional CDM testing system. Unlike the human body model, the CDM testing system uses a parasitic capacitor having a metal electrode 92 in contact with the surface of an IC package and an IC chip electrode 93 in a package 91 of dielectric material. After the parasitic capacitor has been charged, it is discharged to ground via the earth line 88 through a switch 94 to estimate the ESD sensitivity of the IC.

Since the creation of static electricity highly depends on the environment, it is important that the ESD test will not be affected by circumstances such as temperature, humidity, testing machine used and so on. In other words, there is an important problem in that the discharge waveform should be uniform with better reproducibility. The testing method of the prior art uses a mercury relay as a switch for discharging a capacitor (which corresponds to the switch 83 in FIG. 10) to allow the standardization of buildup property in the discharge waveform by suppressing a chattering in the discharge waveform and also holding the wiring capacity and inductance component as low as possible. Since any relay has a stray capacitance ranging between several of pF's and several tens pF, however, the discharge waveform depends on the characteristics of the relay and is different from the electrostatic discharge actually encountered in the IC, that is, corona discharge or spark discharge. Thus, minute ICs developed in recent years tend to exhibit a sufficient strength in the publicly standardized ESD test, but have been found to be electrostatically defective in actual markets. The results estimated by the testing method of the prior art will not be acceptable in the markets and there is a need for an improved testing method and apparatus.

SUMMARY OF THE INVENTION

In view or the above problems, it is an object of the present invention to provide a method and apparatus for testing a semiconductor device which can reproduce the electrostatic discharge of a semiconductor device as accurately as possible and which can be acceptable in the markets.

To this end, the present invention provides a method for testing a semiconductor device, comprising the steps of grounding a terminal to be tested in a semiconductor device and applying a high voltage to the terminal to be tested through a first discharging portion having a first discharge gap and estimating the electrostatic discharge sensitivity in the semiconductor device.

The present invention also provides an apparatus for testing a semiconductor device, comprising a test terminal grounded through an earth line and in contact with a terminal to be tested in the semiconductor device, a first discharge portion connected at a first end to the terminal to be tested, the first discharge portion including a first discharge gap having a given length, and a power source connected to a second end of the discharge portion and adapted to generate a high voltage to be discharged, wherein the electrostatic discharge sensitivity of the semiconductor device is estimated by applying the high voltage to the terminal to be tested in the semiconductor device through the first discharge portion.

The present invention further provides an apparatus for testing a semiconductor device, comprising an earth terminal connected to the terminal to be tested in the semiconductor device, the earth terminal grounding the terminal to be tested, a discharge electrode forming a first discharge portion including a first discharge gap or a given length between the discharge electrode and the terminal to be tested and a power source connected to the discharge electrode and adapted to generate a high voltage to be discharged, wherein the high voltage is applied to the terminal to be tested in the semiconductor device through the discharge portion to estimate the electrostatic discharge sensitivity of the semiconductor device.

In the method and apparatus of the present invention, the terminal to be tested is grounded and the high voltage is applied to the grounded terminal through the discharge portion. The application of the high voltage generates a corona or spark at the discharge portion. As a result, charges will rapidly flow into the terminal to be tested. Since the terminal to be tested is grounded, a stable testing condition can be created independently of the amount of charge in the semiconductor device or the like.

Consequently, the estimation obtained in the ESD test can approach the electrostatic discharge phenomenon created in the actual semiconductor device in normal use. The desired electrostatic discharge phenomenon can be reproduced with a much higher accuracy than in the prior art.

BRIEF DESCRIPTION OF THE DRAWINGS

FIGS. 3A–3C are views showing the dependency on the number of applications of a high voltage to be discharged.

FIG. 5 is a table illustrating the concrete values of the electrical characteristics in the earth line.

DETAILED DESCRIPTION OF THE PREFERRED EMBODIMENTS

Figure 1:
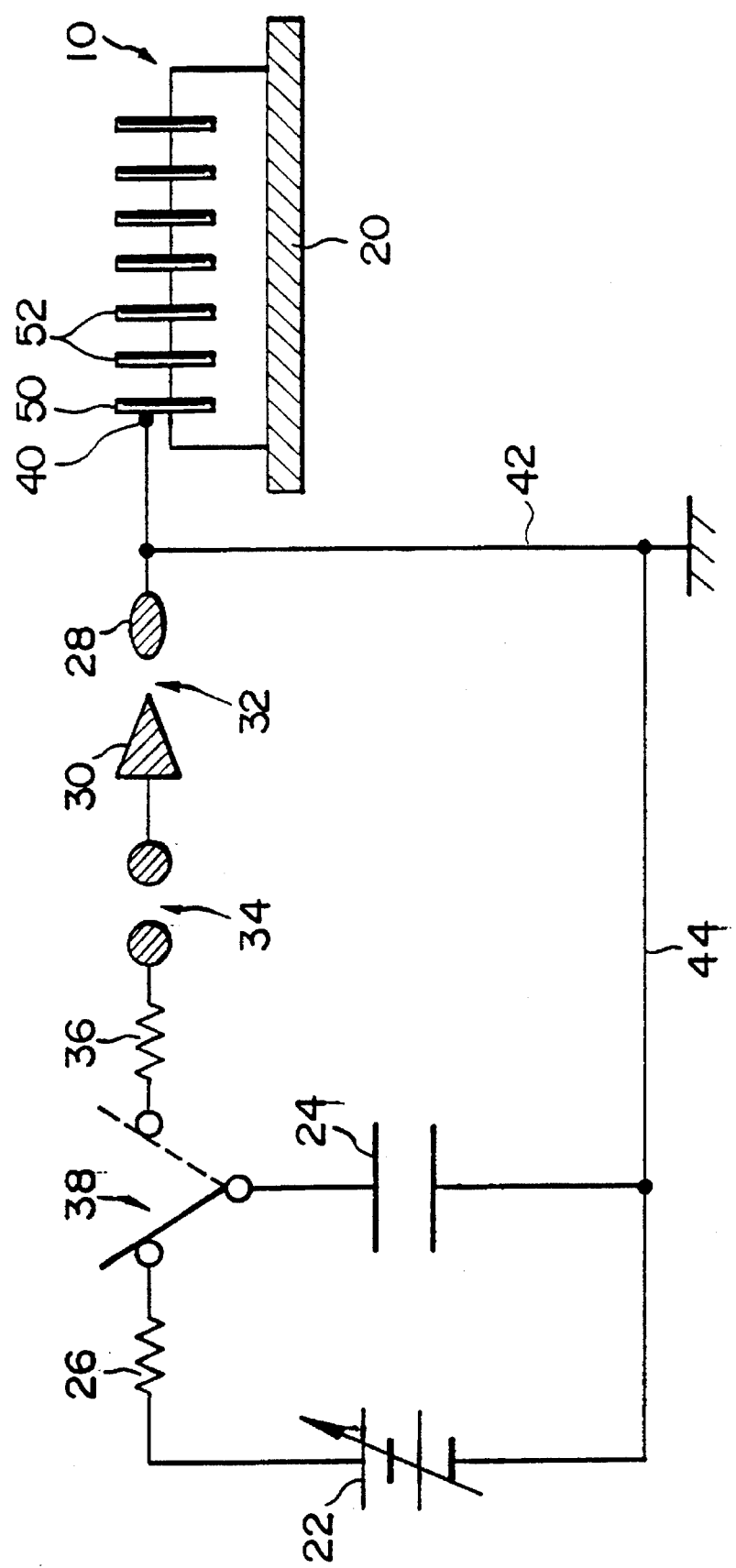
FIG. 1 is a schematic view of one embodiment of a testing apparatus to which the present invention is applied.

Referring to FIG. 1, there is shown one embodiment of a testing apparatus according to the present invention. FIG. 1 also shows a testing circuit used in the testing apparatus and the connection between the testing circuit and an IC 10 to be tested.

The testing apparatus of the present invention comprises an insulator 20 on which the IC 10 is fixedly placed; a power source for generating an electrostatic discharge and defined by a high-voltage source 22, a capacitor 24 and a charging protection resistor 26; a variable discharge gap 32 in a discharge portion defined by a metal piece 28 and a discharge electrode 30; a fixed gap 34; a discharge resistor 36 inserted into a discharge circuit; and a switch 38 for conducting electrostatic charge to the discharge circuit.

The capacitor 24 is connected at one end to the negative electrode of the high voltage source 22 and also to the ground. The other end of the capacitor 24 is connected to either the positive electrode of the high voltage source 22 through the switch 38 or to resistor 26 through switch 38. When the switch 38 is switched to connect the capacitor 24 to the resistor 26, there will be formed a closed loop including the capacitor 24 and the high voltage source 22.

The discharge resistor 36 and the two discharge gaps 34 and 32 define a series circuit which is connected at one end to one end of the capacitor 24 through the switch 38. The other end of the series circuit is connected to the other end of the capacitor 24 and also to the ground. When the switch 38 is switched to connect the capacitor 24 to the discharge resistor 36, there will be formed a closed loop containing the capacitor 24 and the discharge gaps 34 and 32. The other end of the series circuit is also connected to a terminal to be tested 50 of the IC 10 through the test terminal 40.

The IC 10 will be tested in ESD sensitivity by the aforementioned testing apparatus in the following manner:

First of all, the switch 38 is switched to connect one end or the capacitor 24 to the positive electrode of the high voltage source 22 through the resistor 26. Thus, the capacitor 24 is charged by the electrostatic discharge from the high voltage source 22. The capacitor 24 may have a capacity ranging between 100 pF and 200 pF and the resistor 26 may be equal to about several M Ω, sufficient to function as a protection resistor on charging.

After the capacitor 24 has been sufficiently charged, the switch 38 is switched to connect the one end of the capacitor 24 to the discharge resistor 36 so that the electrostatic charge will be discharged from the capacitor 24 to the terminal to be tested 50 of the IC 10 through the two discharge gaps 34 and 32. A suitable spacing is formed between the discharge electrode 30 and metal piece 28 which together form the discharge gap 32. The discharge from the capacitor 24 generates a spark or corona. More particularly, the spacing between the discharge electrode 30 and the metal piece 28 is required to be equal to about several hundreds μm if the discharge voltage is equal to 2 kV.

All the terminals 52 other than the terminal to be tested 50 of the IC 10 are opened and the IC 10 is placed on the insulator 20. A return line 44 connecting the capacitor 24 to an earth line 42 grounding the test terminal 40 is preferably in the form of a net-like copper wire having an increased conductor surface area and a reduced impedance, in consideration of the skin effect of high-frequency current.

After the capacitor 24 has been discharged, the electrical characteristics of the IC 10 is measured by an IC tester 11 to define an estimate of a discharge voltage immediately before a leak current is created or the IC 10 is abnormally operated (e.g. 3000 volts) as an ESD sensitivity level. Such an IC tester is conventional and well known to those of skill in the art.

In order to stabilize the discharge in the testing circuit of FIG. 1, the discharge gap 34 is provided in the forward stage of the discharge gap 32 to function as a kind of regulator. The discharge gap 34 is fixed and adapted to generate a corona or spark on discharging similar to the discharge gap 32. The provision of the discharge gap 34 in the series circuit can provide a voltage waveform having more uniform buildup which can provide data improved in reproducibility without dependency on the length of the earth line 42, the shape of the metal piece 28 and the environment. The discharge gap 32 between the discharge electrode 30 and the metal piece 28 is variable in the range from several hundreds μm to several mm. The size of the discharge gap 32 is selected in consideration of the voltage to be applied and the dielectric breakdown voltage of air.

Figure 2A:
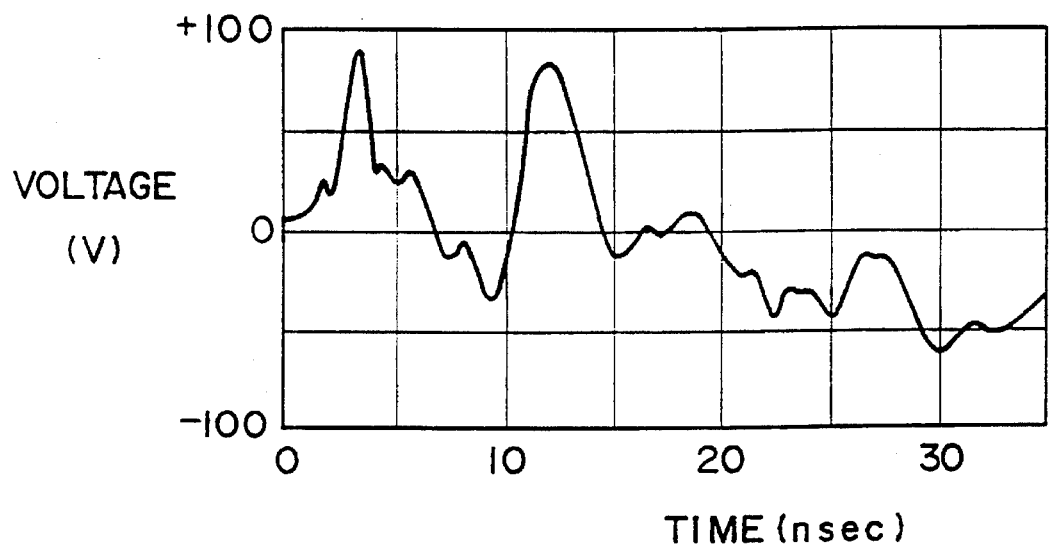
FIGS. 2A and 2B are views illustrating the comparison of waveforms between the testing apparatus of the present invention and the testing apparatus of the prior art.
Figure 2B:
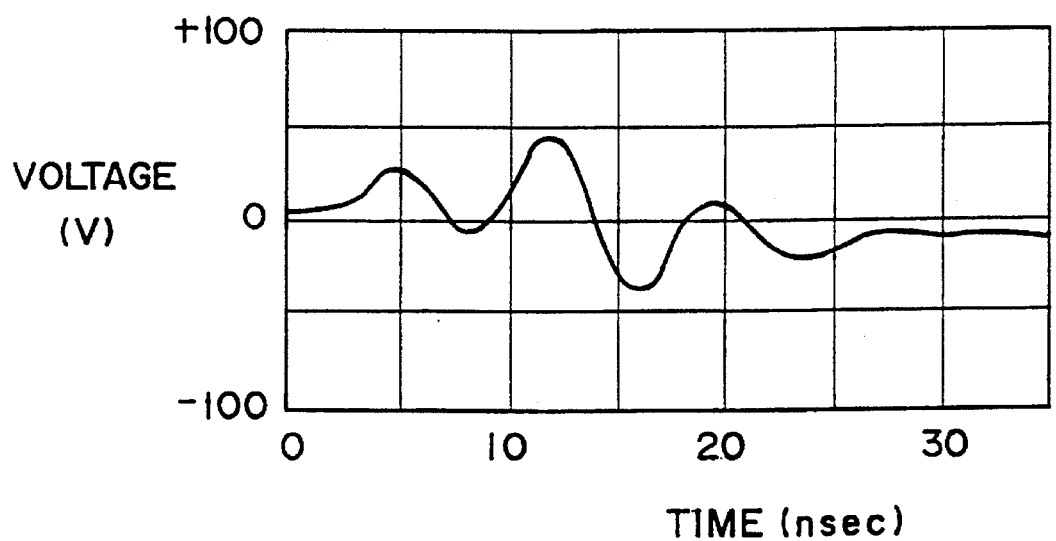

FIGS. 2A and 2B show the comparison between the discharge waveform in the testing apparatus of the present invention and the discharge waveform in the testing apparatus of the prior art. In these figures, each of the waveforms was obtained through an oscilloscope when a resistor of 100 m Ω was inserted into the earth line 42 and the voltage between the opposite ends of the resistor was observed. The ordinate axis denotes voltage and the abscissa axis designates elapsed time.

It will be apparent from FIG. 2A that the testing apparatus of the present invention exhibits a sharp buildup property equal to several hundreds picoseconds and that discharge waveforms known as "brush" or "hossu" corona waveforms are overlapped one above another.

FIG. 2B shows the discharge waveform in the CDM test of the prior art, this waveform having its buildup property ranging between 5 nanoseconds and 10 nanoseconds. From the comparison, it is understood that the testing apparatus of the present invention is improved in buildup property by about ten times higher than the prior art. As a result, the change of charge (current) per unit time in the electrostatic protection diode electrically connected to the terminal to be tested 50 according to the present invention is increased ten or more times higher than that of the prior art testing apparatus. IF the same voltage as in the prior art is applied to the testing apparatus of the present invention, the test will more severely be carried out by applying a greater change in current per unit time to the terminal to be tested 50.

Two different types of ICs were evaluated by the testing apparatus of the present invention and the testing apparatus of the prior art (MIL, EIAJ and CDM). The results are shown in the following table:

|  | A Type | B Type |
| --- | --- | --- |
| MIL Standard | 3800V | 4000V |
| EIAJ Standard | 500V | 550V |
| CDM (Package Charge) | 2000V | 2000V |
| Failure (percent defective) due to ESD in assembly process | 9% | 1–5% |
| Results in the Testing Apparatus of the Present Invention | 4500V | 1500V |

Both the ICs of types A and B exhibited to be sufficiently strong according to the ESD testing method of the prior art, but only B type exhibited the failure (percent defective) due to ESD in assembly process. When the ESD sensitivity level strength of the two types of ICs was estimated according to the testing apparatus of the present invention, it was found that the ICs of type B were extremely low in ESD sensitivity level strength compared with the Its of type A. This is correlative intimately to the failure due to ESD in assembly process. In other words, the testing apparatus of the present invention can estimate the ESD sensitivity level strength of ICs in the actual electrostatic environment, which the prior art devices were not able to accomplish.

FIGS. 3A–3C show the total results of the dependency on the number of applications of a high voltage to be discharged when electrostatic voltages are applied to a plurality of pins having different electrostatic characteristics in an individual IC. FIG. 3A shows the breakdown voltage due to one discharge which is obtained by plotting voltage values applied to IC 10 when the IC was broken as the voltage being incremented by 500 V steps. This checks how much voltage the IC 10 is broken down by. In FIG. 3A, the abscissa axis represents the number of broken ICs 10.

FIG. 3B shows the results when the high voltage is applied to an individual IC three times. More particularly, it shows the breakdown voltage duo to discharges of three times which is obtained. FIG. 3C shows the results of a similar test when the discharges are performed 30 times.

From those results, it was found that the breakdown voltages for ICs 10 are dispersed over a certain range and do not depend on the number of voltage applications. However, as the number of voltage applications is increased, the breakdown voltages tend to be less scattered with more stable results. It can be said that the number of voltage applications equal to about 20 per step voltage is reasonable.

Figures 4A, 4B, 4C, 4D, 4E:
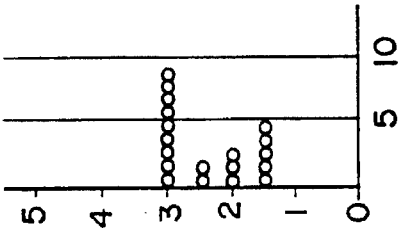
FIGS. 4A–4J are views showing the dependency on the electrical characteristics of the earth line.
Figure 4J:
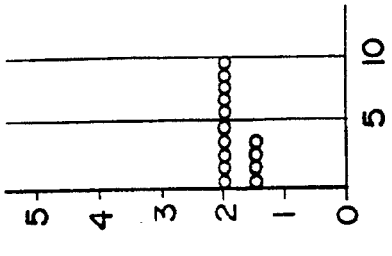
Figure 4I:
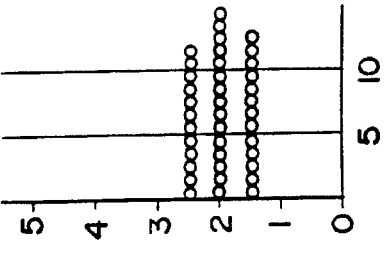
Figure 4H:
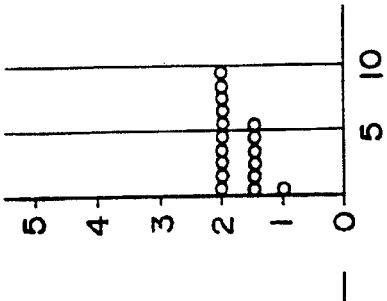
Figure 4G:
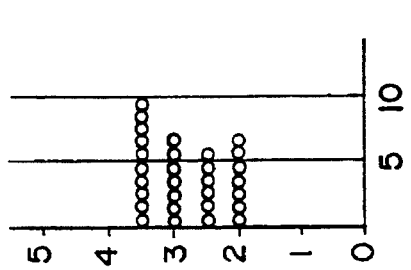
Figure 4F:
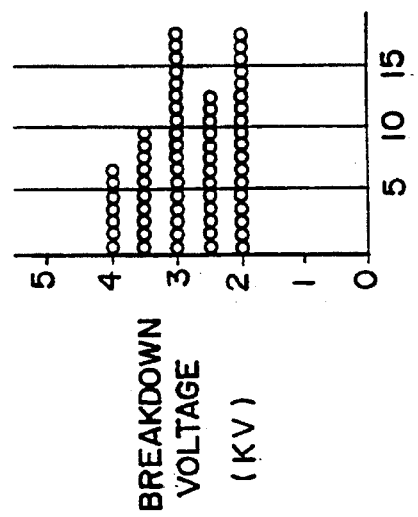

FIGS. 4A–4J show the dependency of the earth line 42 on its electrical characteristics relative to the breakdown voltage of the IC 10 when the electrostatic voltages are applied to a plurality of pins different in electrostatic characteristics in an individual IC as in FIGS. 3A–3C. FIGS. 4A–4J also show the results obtained by checking the breakdown voltage of the IC 10 when the resistance and inductance of the earth line 42 are variable. FIGS. 4A–4E show the case when the length and diameter of the earth line are variable; FIGS. 4F–4I show the case when the suitable length of the earth line is wound into a coil configuration to add an inductance to the earth line; and FIG. 4J shows the case when a metal film resistor of about one k$\Omega$ is inserted into the earth line. FIG. 5 shows various conditions in the above cases. The number of voltage applications is 20 through all the cases illustrated in FIGS. 4A–4J.

From FIGS. 4A–4J, it will be apparent that the resistance and inductance of the earth line 42 does not clearly depend on the breakdown voltage. On manufacture of the testing apparatus, therefore, it is not required to well consider these parameters (the resistance and inductance of the earth line) if the earth line 42 is made of any conventional wire.

Figure 6:
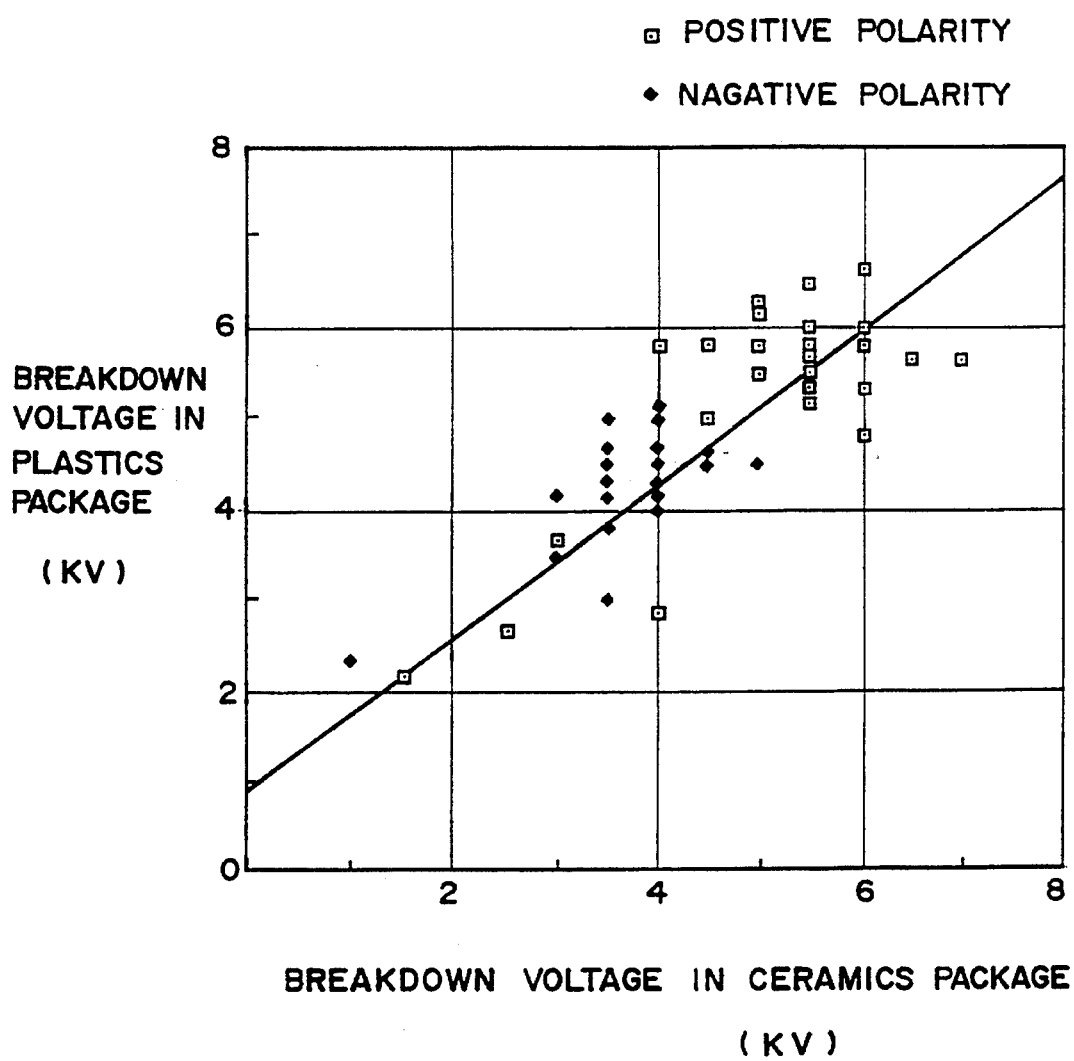
FIG. 6 is a chart illustrating the dependency on the types of package material.

FIG. 6 shows the dependency on the type of package material. Positive and negative voltages are applied to the terminals to be tested of ICs 10 the packages of which are molded of ceramics and plastics in one and the same lot and sampled from each lot. The negative voltage may be applied to the ICs by inverting the polarity in the high voltage source 22. In FIG. 6, the abscissa axis represents breakdown voltages for ICs 10 of ceramics package while the ordinate axis represents breakdown voltages for ICs 10 of plastics package.

It will be apparent from FIG. 6 that the ceramics package is very intimately correlative to the plastics package. Even if the ICs 10 are made of either of the ceramics or plastics package material, substantially the same results may be obtained. The correlation coefficient was 0.723.

In the CDM test generally used in prior the art, only moldings could be tested with accurate reproducibility. However, the testing apparatus of the present invention can test any package material and thus does not require to change the molding materials with respect to semiconductor devices of the same circuit.

Figure 7:
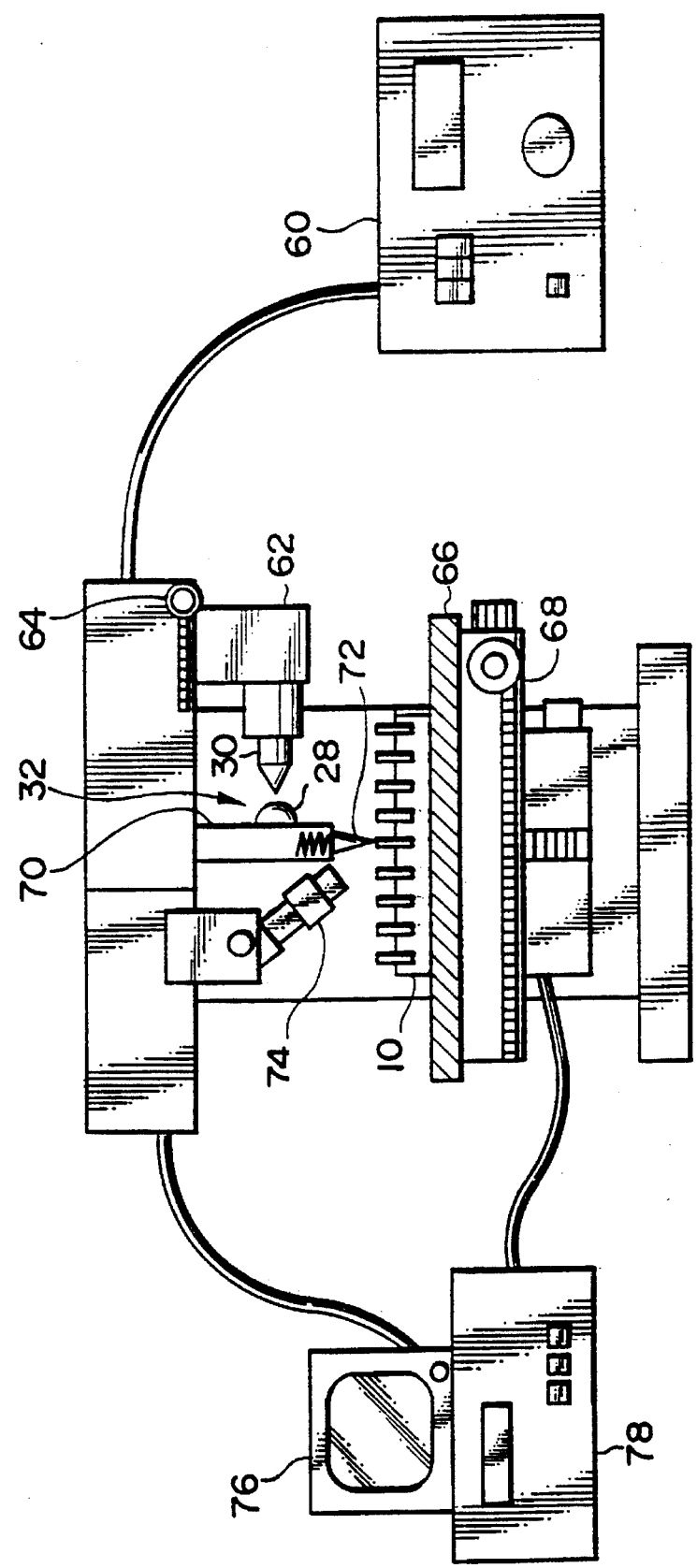
FIG. 7 is a view showing the entire structure of the testing apparatus shown in FIG. 1.

FIG. 7 shows the entire detailed structure of the testing apparatus constructed in accordance with the preferred embodiment of the present invention shown in FIG. 1, including a drive mechanism for the discharge gap 32 and so on.

The high voltage source 22 is included in a high voltage power source 60 and may be set to be variable in voltage value.

A spark discharge unit 62 is defined by the capacitor 24, resisters 26 and 36, switch 38 and discharge gap 34 all of which are shown in FIG. 1. The tip of the spark discharge unit 62 includes a discharge electrode 30 fixedly mounted thereon, which electrode 30 forms one end of the discharge gap 32. The spark discharge unit 62 can be moved in the horizontal direction by a stepping motor 64 to adjust the discharge gap 32.

A test terminal unit 70 is defined by the test terminal 40 and metal piece 28 which are shown in FIG. 1. The tip of the test terminal unit 70 includes a probe 72 adapted to contact the terminal to be tested 50 of the IC 10, the probe 72 corresponding to the test terminal 40. The test terminal unit 70 will be described in detail later.

A position detecting TV camera 74 is used to visually observe whether or not the probe 72 on the tip of the test terminal unit 70 is positively in contact with the terminal to be tested 50 of the IC 10. The image taken by the TV camera 74 is shown on a display 76.

An insulation base 66 corresponding to the insulator 20 of FIG. 1 receives an IC 10 with its package part being directed downwardly and with the terminal to be tested 50 and other terminals 52 being directed upwardly. The insulation base 66 is mounted on an XYZ stage 68 which is movable in all the directions X, Y and Z. The XYZ stage 68 includes three stepping motors (not shown) which drive the XYZ stage 68 in all the directions.

The three stepping motors on the XYZ stage 68 are individually control led by a controller 78. Thus, the controller 78 controls the stepping motors on the XYZ stage 68 so that an IC 10 placed on the insulation base 66 can be positioned at any desired location to bring the probe 72 into contact with any of the terminals.

Figure 8:
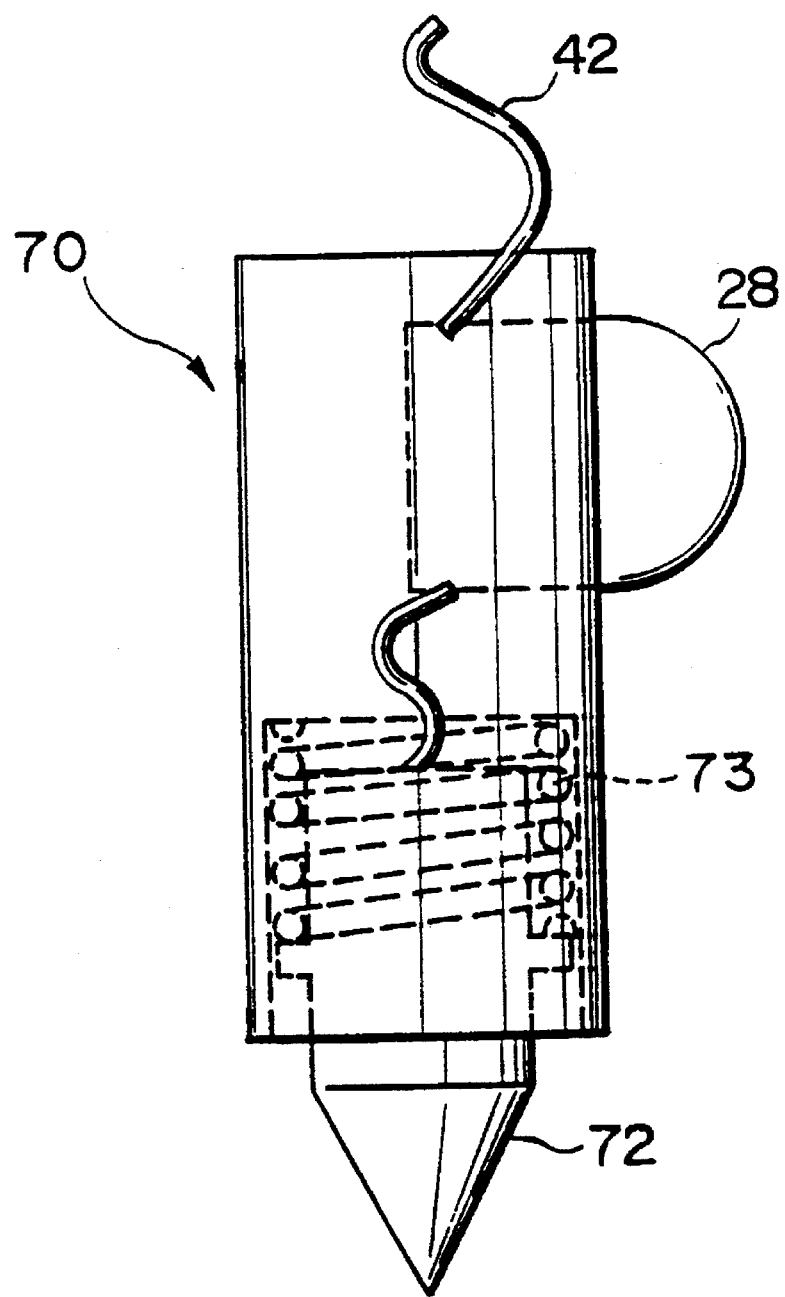
FIG. 8 is a view showing the detailed structure of the test terminal unit shown in FIG. 7.

FIG. 8 shows the details of the test terminal unit 70. The test terminal unit 70 comprises a spring 73 urging the probe 72 downwardly and the metal piece 28 electrically connected to the probe 72. The metal piece 28 is also connected to the earth line 42. The metal piece 28 is located opposed to the discharge electrode 30 mounted on the tip of the spark discharge unit 62. The metal piece 28 and discharge electrode 30 define a discharge gap 32 having any desired size.

In such an arrangement, the terminal to be tested 50 of an IC 10 is grounded and then a high voltage is applied to the terminal to be tested 50 through the discharge gap 32. Thus, the discharge gap 32 generates a corona or spark. Since the testing apparatus can simulate these discharges which would be generated when the IC 10 was exposed to the actual static electricity, it can estimate ICs with respect to their faults due to the electrostatic current waveform having a very rapid buildup, which would not be estimated by the capacitor discharge test and other tests defined by the public standards (MIL standard and so on), with better reproducibility. Since the terminal to be tested is grounded and then a discharge is made between the grounded terminal and the metal terminal having the same potential as that of the terminal to be tested, the testing apparatus of the present invention does not depend on the type of package material and humidity or other environmental factors as in the CDM test and thus can accurately measure the electrostatic strength of the IC.

It is further required to change the size of the discharge gap 32 depending on the type of IC 10. Since the testing apparatus of the present invention can horizontally move the spark discharge unit 62 to any desired location by the stepping motor 64 to simply change the size of the discharge gap 32, the testing apparatus of the present invention can perform electrostatic tests over a wide range or applications without depending on the type of IC 10. In addition, since the XYZ stage 68 supporting the insulation base 66 on which the IC 10 is placed can be moved to any position, one of all the terminals can be selected to be a terminal to be tested and the electrostatic test can be carried out with an increased degree of freedom, compared with the prior art in which a socket or the like must be mounted.

The present invention is not limited to the illustrated embodiment, but may be embodied with many modifications within the scope of the invention.

Although the embodiment or the present invention has been described as to two discharge gaps 32 and 34 at each of which the corona or spark is generated, the number and structure of these gaps may optionally be selected.

Figure 9A:
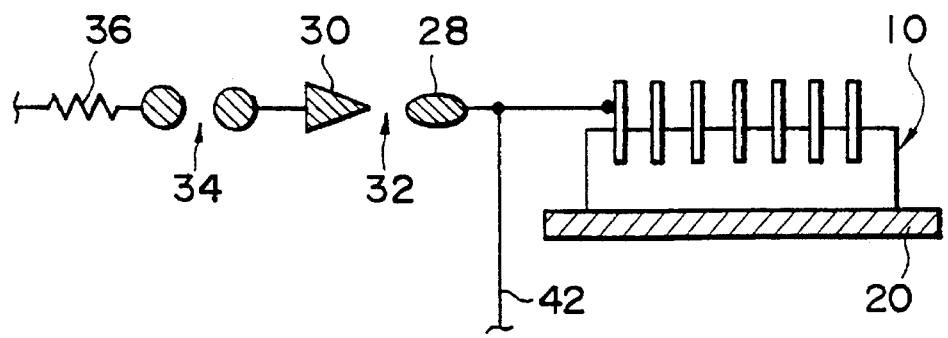
FIGS. 9A–9C are views showing the structure around the discharge gap shown in FIG. 1.
Figure 9B:
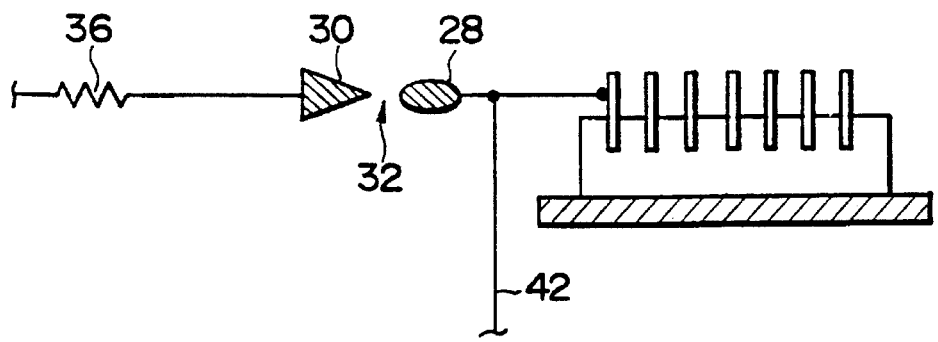
Figure 9C:
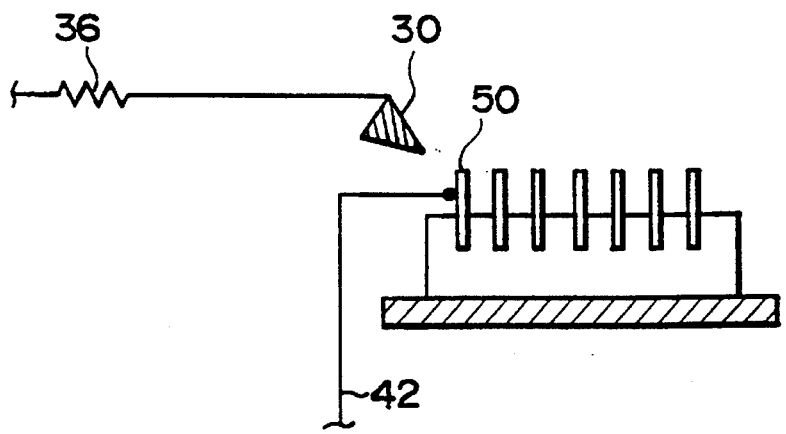
Figure 10:
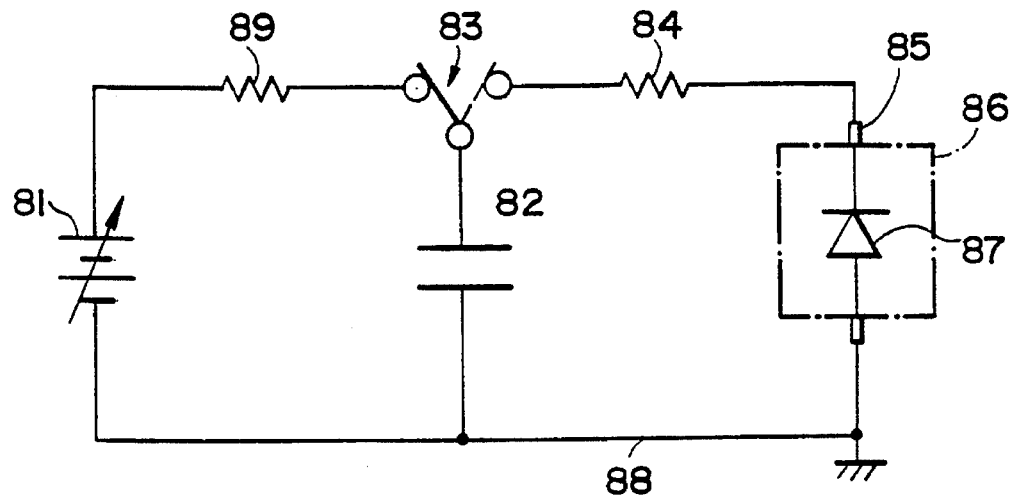
FIG. 10 is a circuit diagram illustrating a capacitor discharge testing method in accordance with the prior art.
Figure 11:
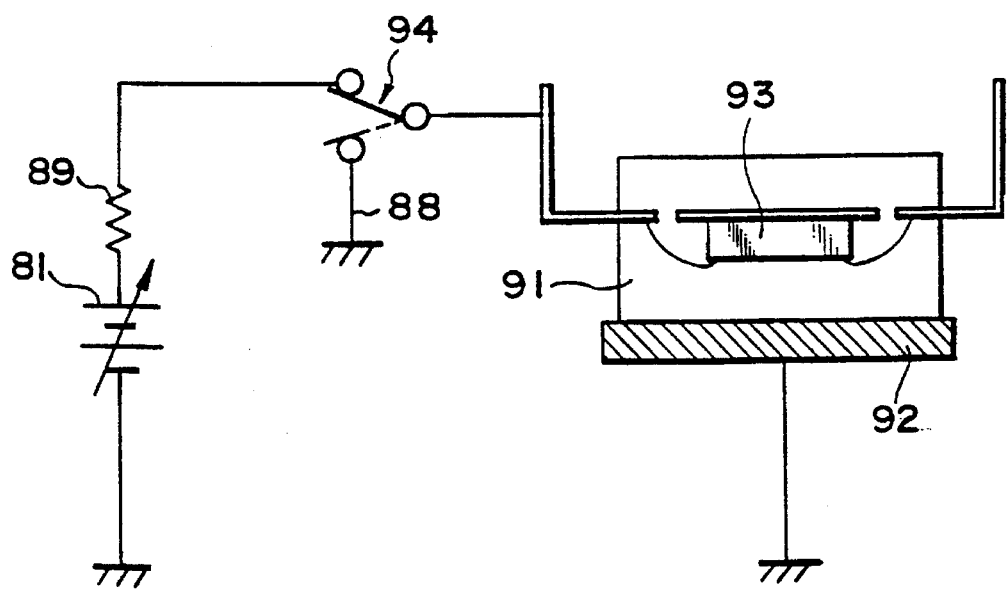
FIG. 11 is a circuit diagram of a CDM testing apparatus constructed in accordance with the prior art.
Figure 12:
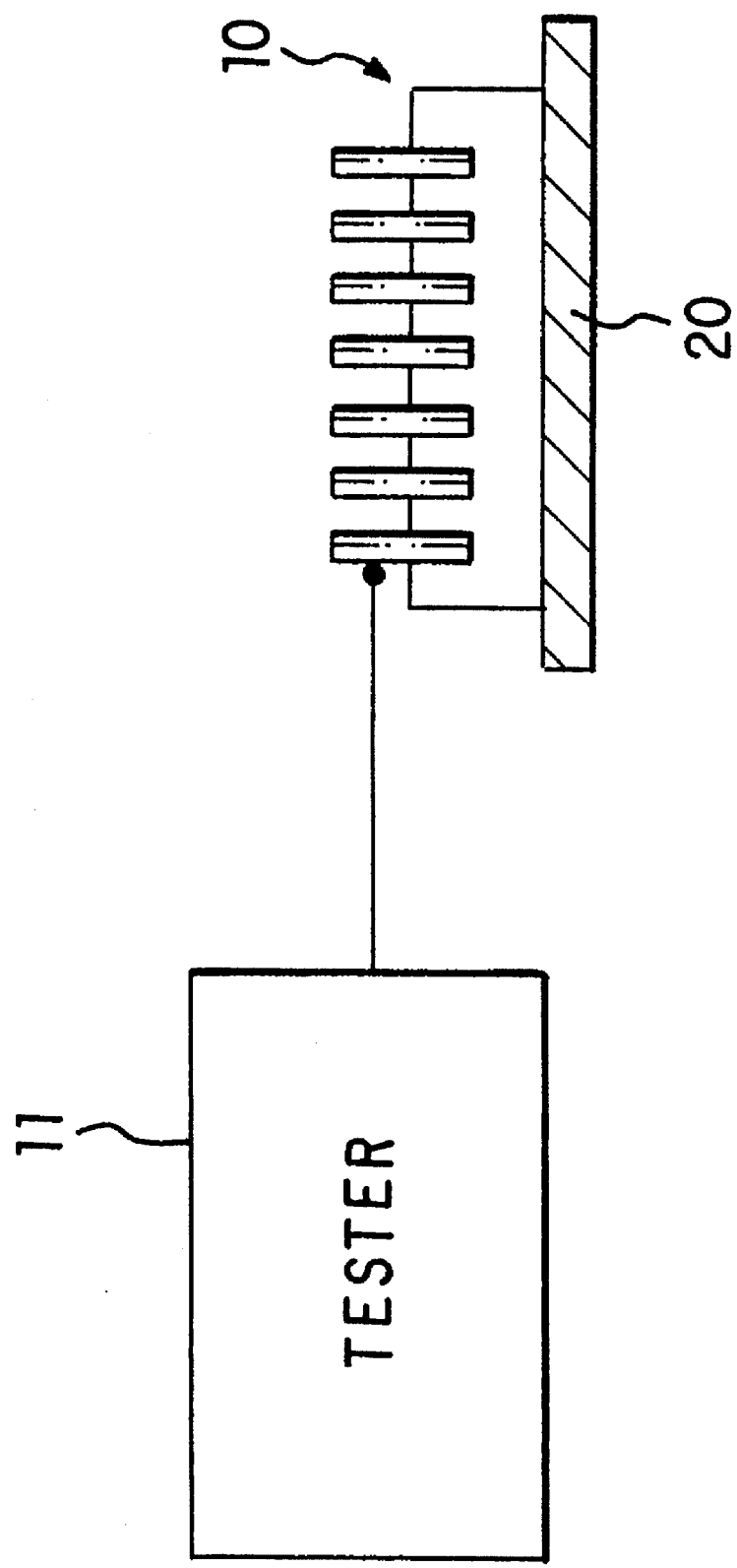
FIG. 12 is a view illustrating the IC tester of the present invention.

FIGS. 9A–9C show the other embodiments of the present invention having various arrangements about the discharge gap 32 shown in FIG. 1. FIG. 9A shows two discharge gaps 32 and 34 while FIG. 9B shows only one discharge gap 32. It is to be understood that even if only the discharge gap 32 is used without the other discharge gap 34 to generate the corona or spark at the discharge gap 32, the same sharp buildup property as in the aforementioned embodiment can be obtained.

FIG. 9C shows an arrangement in which such a metal piece 28 as shown in FIG. 9B is omitted to locate the discharge electrode 30 nearer the terminal to be tested 50. At this case, the earth line 42 is connected directly to the terminal to be tested 50 while the discharge electrode 30 is adjusted to provide a discharge gap having a desired size between the discharge electrode 30 and the terminal to be tested 50. The arrangement of FIG. 9C is substantially the same as that of FIG. 9B and can provide a sharp buildup property if a corona or spark is generated between the discharge electrode 30 and the terminal to be tested 50.

Furthermore, the stepping motors for moving the discharge electrode 30 and IC 10 may be replaced by any other suitable drive means which can control its movement.

Since in the present invention, the terminal to be tested is grounded while a high voltage is applied to the grounded terminal through the discharge portion to generate the corona or spark, the charge due to discharge can rapidly flow into the terminal to be tested to imitate a phenomenon very similar to the actual discharge produced when the IC is in actual use in the markets. Therefore, the present invention can provide the testing method and apparatus which are correlative to the actual faults in use in the fields.

I claim:

1. A method for testing a semiconductor device, comprising the steps of:

grounding a terminal to be tested in the semiconductor device;

applying a controlled high voltage to said terminal to be tested through a first discharge portion having a first discharge gap; and estimating the electrostatic discharge sensitivity of the semiconductor device.

2. A method for testing a semiconductor device as defined in claim 1 wherein said first discharge portion generates a spark discharge.

3. A method for testing a semiconductor device as defined in claim 1 wherein said first discharge portion generates a corona discharge.

4. An apparatus for testing a semiconductor device, said apparatus comprising:

a test terminal grounded through an earth line and in contact with a terminal to be tested in the semiconductor device;

a first discharge portion connected at a first end to the test terminal, the first discharge portion including a first discharge gap having a given length;

a controlled power source connected to a second end of the first discharge portion and adapted to generate a high voltage to be discharged, wherein the high voltage is applied to the terminal to be tested in the semiconductor device through the first discharge portion; and means for estimating the electrostatic discharge sensitivity of the semiconductor device.

5. An apparatus for testing a semiconductor device as defined in claim 4 wherein said first discharge portion generates a spark discharge.

6. An apparatus for testing a semiconductor device as defined in claim 4 wherein said first discharge portion generates a corona discharge.

7. An apparatus for testing a semiconductor device as defined in claim 4 wherein the given length of the first discharge gap in the first discharge portion is variable.

8. An apparatus for testing a semiconductor device as defined in claim 7 wherein the given length of the first discharge gap in the first discharge portion is adjusted by the use of a stepping motor.

9. An apparatus for testing a semiconductor device as defined in claim 4, further comprising a second discharge portion connected between the controlled power source and the first discharge portion, the second discharge portion having a second discharge gap, the second discharge gap having a fixed length.

10. An apparatus for testing a semiconductor device as defined in claim 4, further comprising a switch for connecting a capacitor to one of said controlled power source and said first discharge portion, the capacitor charging to the high voltage when connected to said controlled Dower source and discharging said high voltage to said first discharge portion when connected to said first discharge portion.

11. An apparatus for testing a semiconductor device as defined in claim 4 wherein said test terminal includes a probe.

12. An apparatus for testing a semiconductor device as defined in claim 5, further comprising a switch for connecting a capacitor to one of said controlled power source and said first discharge portion, the capacitor charging to the high voltage when connected to the controlled power source and discharging said high voltage to said first discharge portion when connected to said first discharge portion.

13. An apparatus for testing a semiconductor device as defined in claim 6, further comprising a switch for connecting a capacitor to one of said controlled power source and said first discharge portion, the capacitor charging to the high voltage when connected to the controlled power source and discharging said high voltage to said first discharge portion when connected to said first discharge portion.

14. An apparatus for testing a semiconductor device, said apparatus comprising:
   an earth line connected to a terminal to be tested in the semiconductor device, the earth line grounding the terminal to be tested;
   a discharge electrode forming a first discharge portion including a first discharge gap of a given length between the discharge electrode and the terminal to be tested;
   a controlled power source connected to the discharge electrode and adapted to generate a high voltage to be discharged, wherein the high voltage is applied to the terminal to be tested in the semiconductor device through the discharge portion; and
   means for estimating the electrostatic discharge sensitivity of the semiconductor device.

15. An apparatus for testing a semiconductor device as defined in claim 14 wherein said first discharge portion generates a spark discharge.

16. An apparatus for testing a semiconductor device as defined in claim 14 wherein said first discharge portion generates a corona discharge.

17. An apparatus for testing a semiconductor device as defined in claim 14 wherein the given length of the first discharge gap in the first discharge portion is variable.

18. An apparatus for testing a semiconductor device as defined in claim 14, further comprising a second discharge portion connected between the controlled power source and the first discharge portion, the second discharge portion having a second discharge gap, the second discharge gap having a fixed length.

19. An apparatus for testing a semiconductor device as defined in claim 14, further comprising a switch for connecting a capacitor to one of said controlled power source and said first discharge portion, the capacitor charging to the high voltage when connected to the controlled power source and discharging said high voltage to said first discharge portion when connected to said first discharge portion.

20. A method of testing a semiconductor device as defined in claim 1, wherein the step of applying a high voltage to said terminal to be tested includes applying the high voltage to the terminal to be tested through a second discharge portion having a second discharge gap, the second discharge gap having a fixed length.

21. An apparatus for testing a semiconductor device, comprising:
   means for grounding a terminal to be tested in the semiconductor device;
   means for applying a controlled high voltage to said terminal to be tested through a first discharge portion having a first discharge gap; and
   means for estimating the electrostatic discharge sensitivity of the semiconductor device.

22. An apparatus for testing a semiconductor device as defined in claim 4, further comprising an IC tester connected to the semiconductor device, wherein the IC tester estimates the electrostatic resistance of the semiconductor device by estimating a discharge voltage of the semiconductor device when a leak current is generated in the semiconductor device.

* * * * *